(12) United States Patent
Chen

(10) Patent No.: US 12,387,972 B2
(45) Date of Patent: Aug. 12, 2025

(54) METHOD FOR MANUFACTURING SHALLOW TRENCH ISOLATION STRUCTURE, SHALLOW TRENCH ISOLATION STRUCTURE AND SEMICONDUCTOR STRUCTURE

(71) Applicant: CHANGXIN MEMORY TECHNOLOGIES, INC., Hefei (CN)

(72) Inventor: Meng-Cheng Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 476 days.

(21) Appl. No.: 17/812,721

(22) Filed: Jul. 14, 2022

(65) Prior Publication Data

US 2023/0052736 A1 Feb. 16, 2023

Related U.S. Application Data

(63) Continuation of application No. PCT/CN2021/129229, filed on Nov. 8, 2021.

(30) Foreign Application Priority Data

Aug. 12, 2021 (CN) .......................... 202110925394.1

(51) Int. Cl.
*H01L 21/762* (2006.01)
*C23C 16/02* (2006.01)
(Continued)

(52) U.S. Cl.
CPC .... *H01L 21/76224* (2013.01); *C23C 16/0236* (2013.01); *C23C 16/401* (2013.01);
(Continued)

(58) Field of Classification Search
None
See application file for complete search history.

(56) References Cited

U.S. PATENT DOCUMENTS 7,354,828 B2   4/2008   Cho
7,667,255 B2   2/2010   Dyer
(Continued)

FOREIGN PATENT DOCUMENTS

CN   103094286 A   5/2013
CN   104576501 A   4/2015
(Continued)

*Primary Examiner* — Asok K Sarkar
(74) *Attorney, Agent, or Firm* — Syncoda LLC; Feng Ma

(57) ABSTRACT

A method for manufacturing a shallow trench isolation structure includes: providing a substrate and forming multiple first trenches in the substrate, in which a cross-sectional width of each first trench increases downward along a vertical direction; forming a continuous first isolation layer on a top of the substrate and inner sides of the multiple first trenches by a deposition process, in which parts of the first isolation layer located in the first trenches form second trenches, and in which a cross-sectional width of each second trench remains constant downward along the vertical direction; and forming a continuous second isolation layer on a surface of the first isolation layer by an ISSG process, in which parts of the second isolation layer located in the second trenches completely fill up the second trenches.

8 Claims, 11 Drawing Sheets

(51) Int. Cl.
    *C23C 16/40*      (2006.01)
    *C23C 16/455*     (2006.01)
    *H01L 21/02*      (2006.01)
    *H01L 21/3065*    (2006.01)

(52) U.S. Cl.
    CPC .. *C23C 16/45525* (2013.01); *H01L 21/02164* (2013.01); *H01L 21/0228* (2013.01); *H01L 21/3065* (2013.01)

(56) References Cited

U.S. PATENT DOCUMENTS

| | | |
|---|---|---|
| 7,737,017 B2 | 6/2010 | Eun |
| 8,329,552 B1 * | 12/2012 | Peng ................. H01L 21/02337 |
| | | 438/692 |
| 9,455,138 B1 * | 9/2016 | Fukazawa ........... H01L 21/0228 |
| 10,886,165 B2 | 1/2021 | Singh |
| 2008/0283890 A1 | 11/2008 | Dyer |
| 2019/0385892 A1 | 12/2019 | Singh et al. |
| 2020/0006114 A1 | 1/2020 | Singh et al. |
| 2020/0075397 A1 * | 3/2020 | Chen ................... H01L 21/0228 |
| 2021/0143158 A1 | 5/2021 | Ha et al. |

FOREIGN PATENT DOCUMENTS

| | | |
|---|---|---|
| CN | 110610896 A | 12/2019 |
| CN | 110970347 A | 4/2020 |
| TW | 200830457 A | 7/2008 |

* cited by examiner

METHOD FOR MANUFACTURING SHALLOW TRENCH ISOLATION STRUCTURE, SHALLOW TRENCH ISOLATION STRUCTURE AND SEMICONDUCTOR STRUCTURE

CROSS-REFERENCE TO RELATED APPLICATIONS

This is a continuation of International Application No. PCT/CN2021/129229 filed on Nov. 8, 2021, which claims priority to Chinese Patent Application No. 202110925394.1 filed on Aug. 12, 2021. The disclosures of the above-referenced applications are hereby incorporated by reference in their entirety.

BACKGROUND

Shallow trench isolation (STI) can provide a small isolation size and a flattened surface, which has gradually become a mainstream isolation process of semiconductor manufacturing processes.

SUMMARY

The disclosure relates to a technical field of semiconductor manufacturing, in particular to a method for manufacturing a shallow trench isolation structure, a shallow trench isolation structure and a semiconductor structure.

Embodiments of the disclosure provide a method for manufacturing a shallow trench isolation structure, a shallow trench isolation structure and a semiconductor structure. By the embodiments of the disclosure, the manufacturing process of a shallow trench isolation structure can be simplified and the insulation property of a shallow trench isolation structure can be improved.

A first aspect of the disclosure provides a method for manufacturing a shallow trench isolation structure, which includes:
  providing a substrate and forming multiple first trenches in the substrate, in which a cross-sectional width of each of the first trenches increases downward along a vertical direction;
  forming a first isolation layer, which is continuous, on a top of the substrate and inner sides of the multiple first trenches by a deposition process, in which parts of the first isolation layer located in the first trenches form second trenches, and in which a cross-sectional width of each of the second trenches remains constant downward along the vertical direction; and
  forming a second isolation layer, which is continuous, on a surface of the first isolation layer by an ISSG process, in which parts of the second isolation layer located in the second trenches completely fill up the second trenches.

A second aspect of the disclosure provides a shallow trench isolation structure, which includes a substrate, a first isolation layer and a second isolation layer. The substrate includes multiple first trenches, in which a cross-sectional width of each of the first trenches increases downward along a vertical direction. The first isolation layer is located on inner sides of the first trenches and a top of the substrate, in which parts of the first isolation layer located in the first trenches form second trenches, and a cross-sectional width of each of the second trenches remains constant downward along the vertical direction. The second isolation layer is located on a surface of the first isolation layer, in which parts of the second isolation layer located in the second trenches completely fill up the second trenches.

A third aspect of the disclosure provides the semiconductor structure includes the shallow trench isolation structure as described in the second aspect.

DETAILED DESCRIPTION

Figure 1:
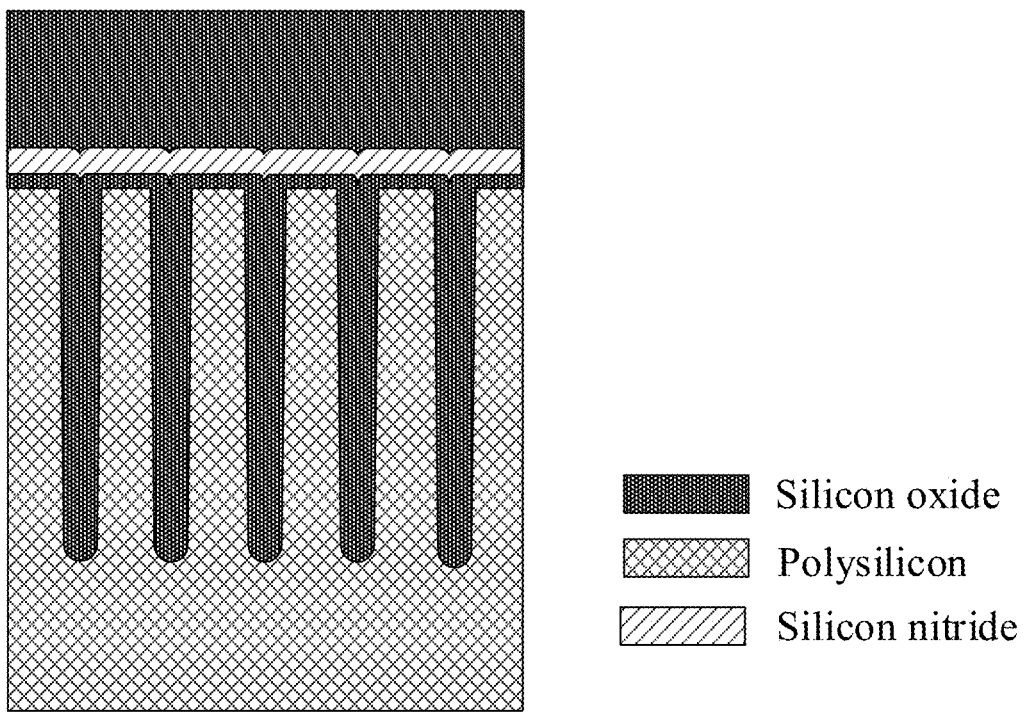
FIG. 1 is a schematic structural diagram of a shallow trench isolation structure in some implementations.

The technical solutions of embodiments of the disclosure will be clearly and fully described below with reference to the drawings in the embodiments of the disclosure. It is to be understood that the specific embodiments described here are only used to explain related disclosures, but not to limit the disclosure. In addition, it is noted that only the parts related to the related disclosures are shown in the drawings for convenience of description.

Unless otherwise defined, all technical and scientific terms used herein have the same meanings as commonly understood by those skilled in the art to which the disclosure pertains. The terms used herein are only for the purpose of describing the embodiments of the disclosure, and are not intended to limit the disclosure.

In the following description, reference is made to "some embodiments", which refers to subsets of all possible embodiments. It should be understood that "some embodiments" may refer to the same subset or different subsets of all possible embodiments, and they may be combined with each other without conflict.

It should be noted that the terms "first", "second", "third" involved in the embodiments of the disclosure are only used to distinguish similar objects, and do not represent a specific order of objects. It can be understood that a specific order or sequence of "first", "second", "third" may be interchanged if permitted, so that the embodiments of the disclosure described here may be implemented in other orders than the one illustrated or described here.

It should be understood that in order to make the purpose, technical solutions and advantages of the embodiments of the disclosure clearer, the embodiments of the disclosure will be described in detail below with reference to the drawings. However, those of ordinary skill in the art can understand that many technical details are presented in various embodiments of this disclosure, in order that this disclosure can be better understood by readers. However, even without these technical details, various changes and modifications made based on the following embodiments may achieve the technical solutions claimed by this disclosure.

The following are the meanings of abbreviations of some terms used in the embodiments of this disclosure.

AA: active area, active areas may be separated by shallow trenches;
ALD: atomic layer deposition;
ISSG: in-situ steam generation;
HQO: high quality oxide; and
DRAM: dynamic random access memory.

A shallow trench isolation structure is an important isolation structure in a semiconductor, which is generally used for isolation between active areas.

In some implementations, in a shallow trench isolation process, when a trench is formed by etching, a cross-sectional width of the trench will gradually decrease with increase in a depth of the trench. That is, a shape of the etched trench is actually a V-shape, not a desired U-shape. Therefore, after initial formation of the trench, it is necessary to carry out subsequent processing on the trench, which leads to a complicated manufacturing process of a shallow trench isolation structure, and an isolation property of a finally obtained shallow trench isolation structure is not ideal.

Referring to FIG. 1, it shows a schematic structural diagram of a shallow trench isolation structure in some implementations. As shown in FIG. 1, the shallow trench isolation structure includes a substrate made of polysilicon. The substrate is provided with multiple trenches filled with silicon oxide. A flattened surface is formed by silicon oxide on the substrate, and further silicon nitride and other functional structures are provided by deposition.

The shallow trench isolation structure is an important part of a DRAM manufacturing process. Although there are many methods for manufacturing the shallow trench isolation structure, these methods all have the disadvantage of complicated manufacturing procedure. Specifically, in a current DRAM process, the U-shaped trenches cannot be directly formed due to the characteristics of the trenches. It is necessary to form the U-shaped trenches by chemical vapor deposition of polysilicon, then fill the trenches by an oxidation process (for example, a HQO ALD process, an ISSG process), and finally obtain the shallow trench isolation structure.

Figure 2A:
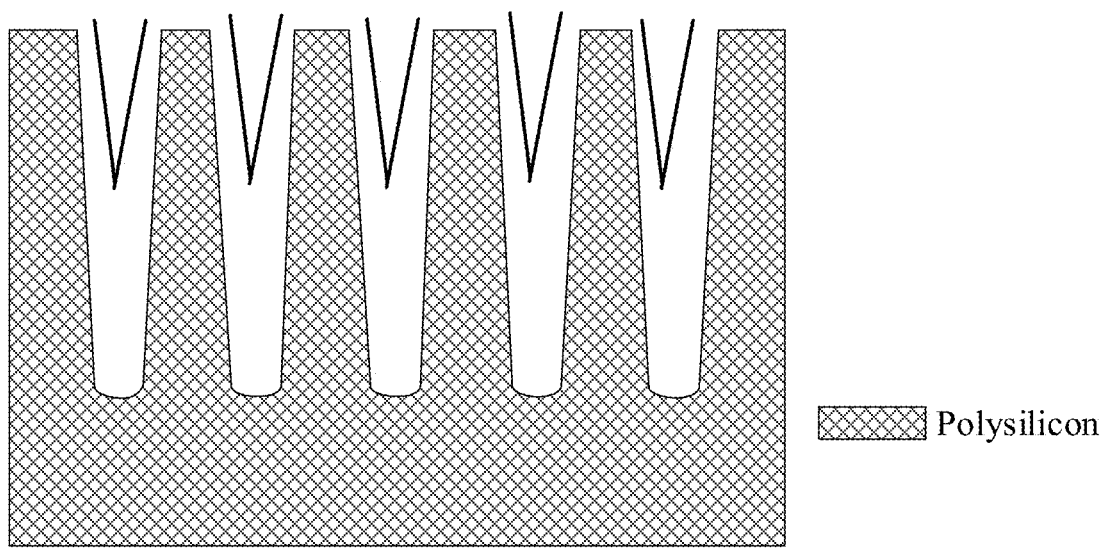
FIG. 2A is a first schematic diagram during manufacturing a shallow trench isolation structure in some implementations.
Figure 2B:
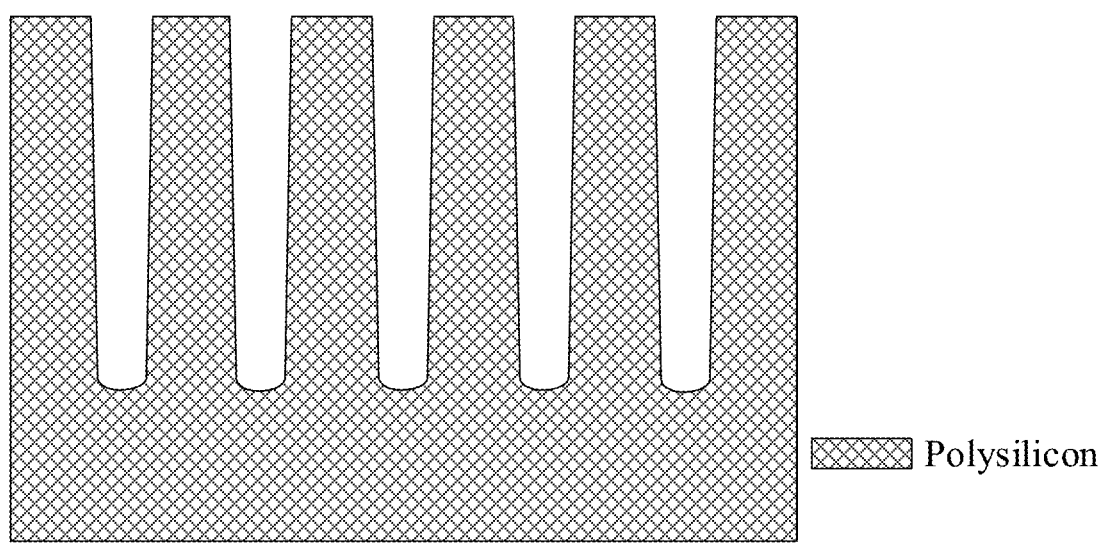
FIG. 2B is a second schematic diagram during manufacturing a shallow trench isolation structure in some implementations.
Figure 2C:
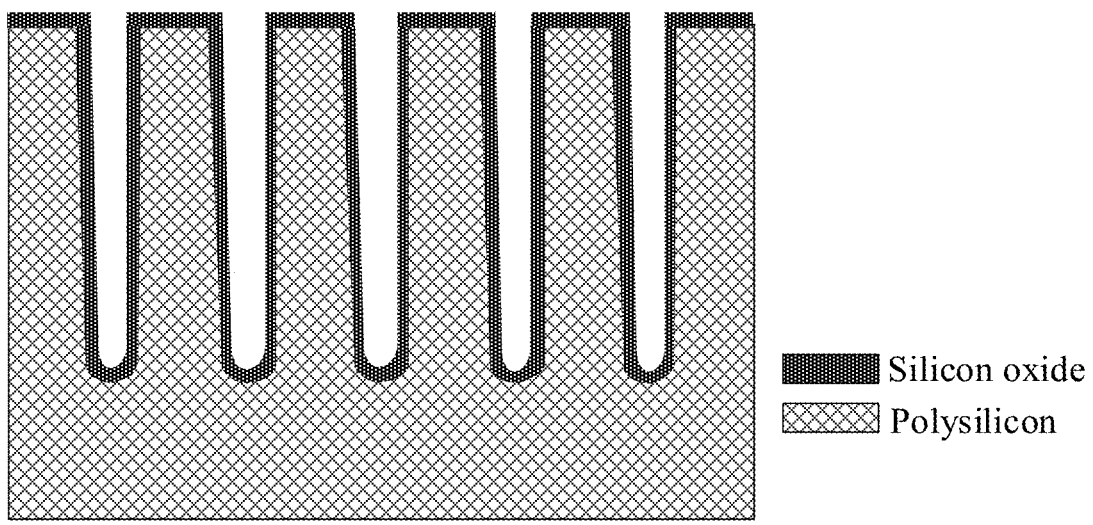
FIG. 2C is a third schematic diagram during manufacturing a shallow trench isolation structure in some implementations.
Figure 2D:
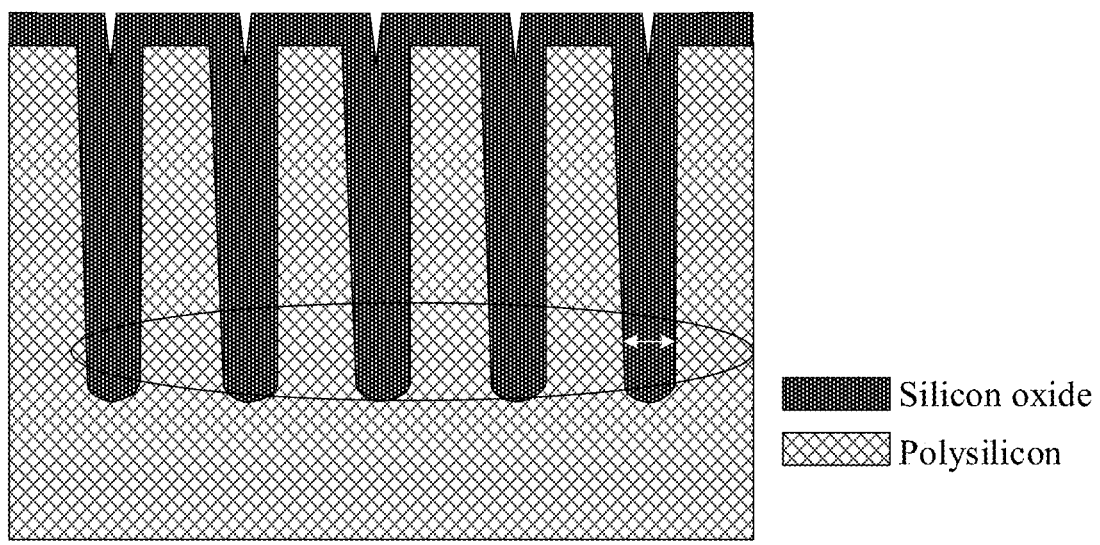
FIG. 2D is a fourth schematic diagram during manufacturing a shallow trench isolation structure in some implementations.

Referring to FIG. 2A to FIG. 2D, they show a flow chart of a method for manufacturing the shallow trench isolation structure in some implementations. As shown in FIG. 2A, for the substrate, after etching the active area (AA), multiple V-shaped trenches are formed. Then, as shown in FIG. 2B, polysilicon is deposited in the V-shaped trenches by a vapor deposition process, to modify each trench to be U-shaped. As a result, the distance between trenches increases, avoiding short circuit of devices. In addition, when polysilicon is deposited, it is necessary to adopt a low step coverage rate, so as to control the cross-sectional width of each trench to be same along the vertical direction and obtain the U-shaped trenches. Then, as shown in FIG. 2C, after the U-shaped trenches are formed, a first silicon oxide layer is formed by oxidation with the HQO ALD process. Then, as shown in FIG. 2D, the trenches are filled by the ISSG process such that the trenches are filled up with a thin silicon oxide layer to achieve an isolation effect.

It can be seen from the above that the current method for manufacturing the shallow trench isolation structure is complicated, and the width of each trench used for being filled with silicon oxide in the shallow trench isolation structure is narrower than expected, which reduces the isolation property. Further, if the manufacturing process of the shallow trench isolation structure is miniaturized, the size of the shallow trench isolation structure obtained thereby is miniaturized. In this case, the nature of an insulation layer of the shallow trenches and the shape of the shallow trenches are very important.

In view of the above, an embodiment of the disclosure provides a method for manufacturing a shallow trench isolation structure. The basic conception of the present method is: providing a substrate and forming multiple first trenches in the substrate, in which a cross-sectional width of each first trench increases downward along a vertical direction; forming a continuous first isolation layer on a top of the substrate and inner sides of the multiple first trenches by a deposition process, in which parts of the first isolation layer located in the first trenches form second trenches, and in which a cross-sectional width of each second trench remains constant downward along the vertical direction; and forming a continuous second isolation layer on a surface of the first isolation layer by an ISSG process, in which parts of the second isolation layer located in the second trenches completely fill up the second trenches. In this way, when the multiple first trenches are formed, the cross-sectional width of each trench is controlled to increase downward along the vertical direction. Then, the cross-sectional width of each trench is modified to remain constant downward along the vertical direction by the first isolation layer. Finally, the trenches are filled up to obtain the shallow trench isolation structure. By the method, the manufacturing process of a shallow trench isolation structure is simplified and the insulation property of the shallow trench isolation structure is improved.

Embodiments of the disclosure will be illustrated in detail below with reference to the drawings.

Figure 3:
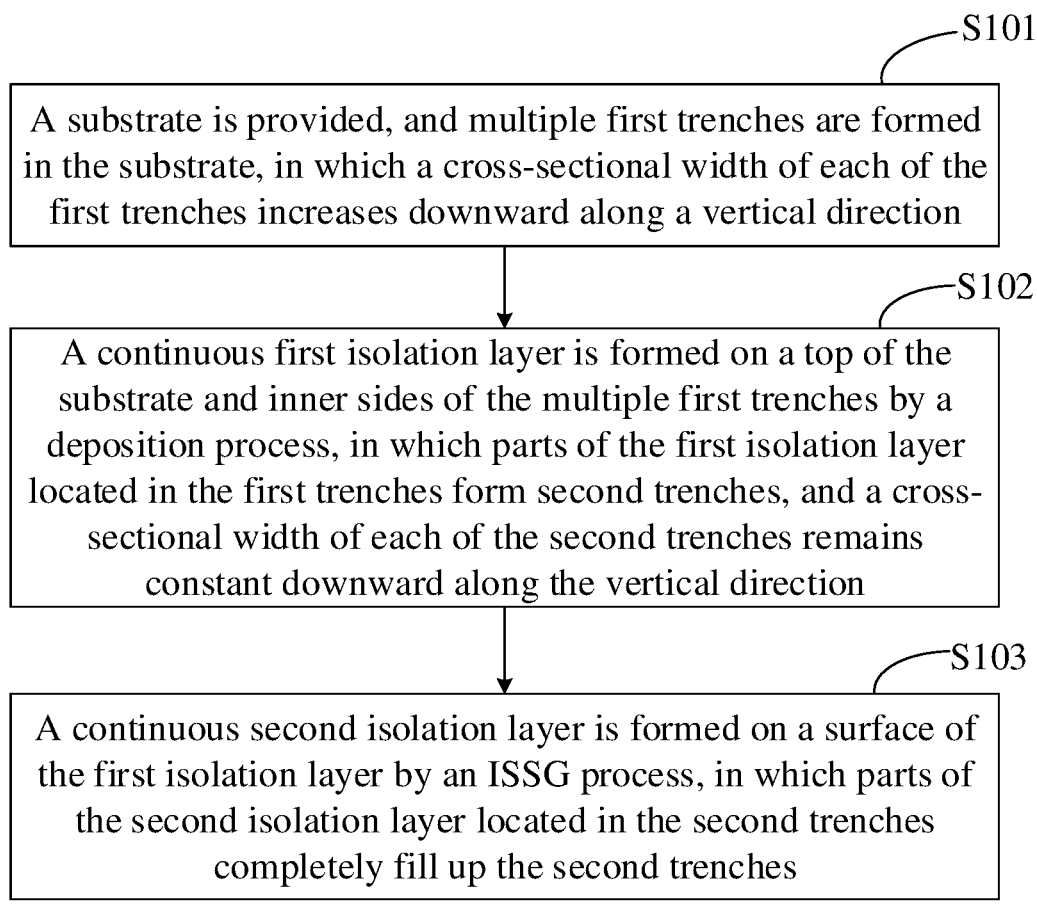
FIG. 3 is a flowchart of a method for manufacturing a shallow trench isolation structure provided by an embodiment of the disclosure.

In one embodiment of the disclosure, referring to FIG. 3, it shows a flowchart of the method for manufacturing a shallow trench isolation structure provided by the embodiment of the disclosure. As shown in FIG. 3, the method can include S101, S102 and S103.

At S101, a substrate is provided, and multiple first trenches are formed in the substrate, in which a cross-sectional width of each of the first trenches increases downward along a vertical direction.

It should be noted that the embodiment of the disclosure provides the method for manufacturing a shallow trench isolation structure which is applied to a semiconductor structure.

Figure 4A:
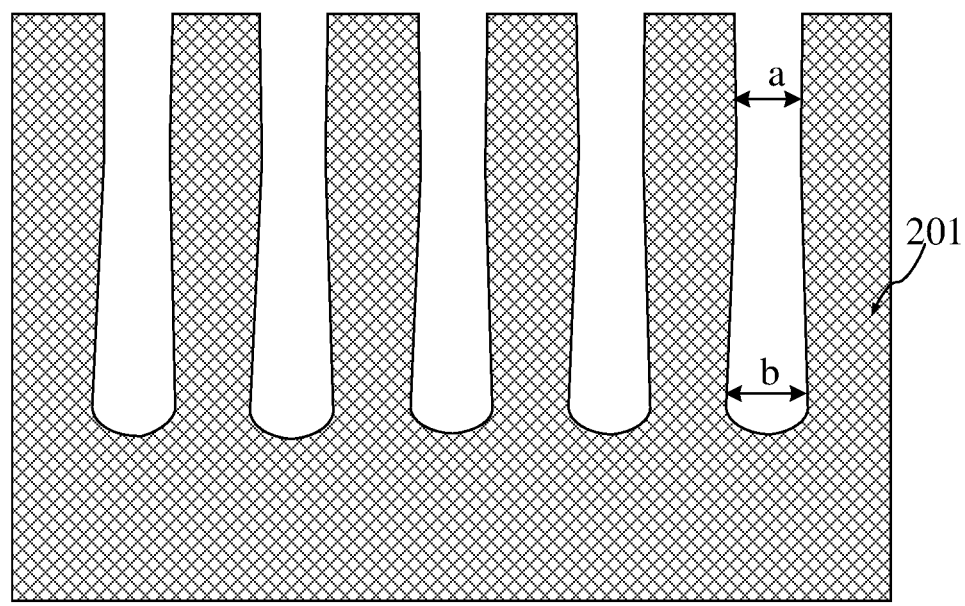
FIG. 4A is a first schematic diagram during manufacturing a shallow trench isolation structure provided by an embodiment of the disclosure.
Figure 4B:
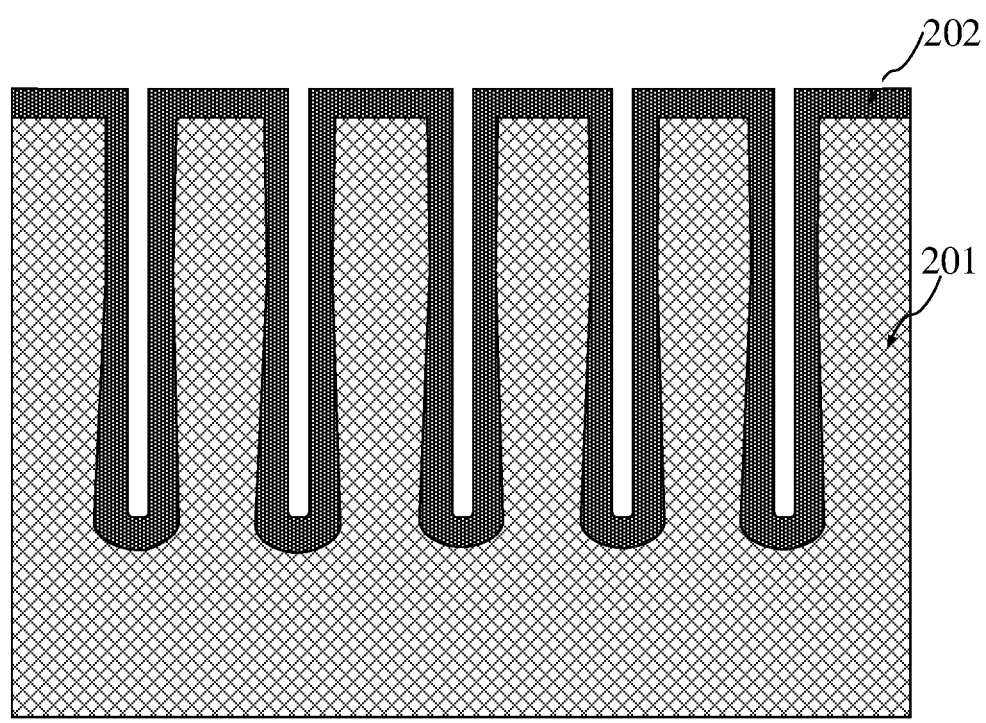
FIG. 4B is a second schematic diagram during manufacturing a shallow trench isolation structure provided by an embodiment of the disclosure.
Figure 4C:
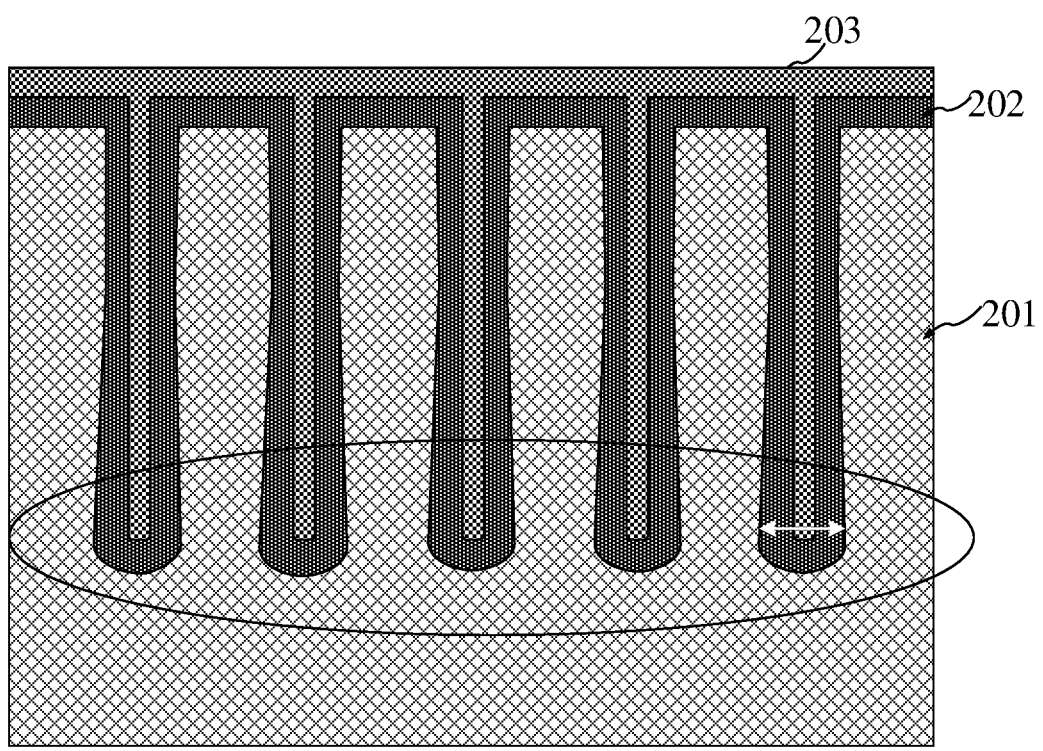
FIG. 4C is a third schematic diagram during manufacturing a shallow trench isolation structure provided by an embodiment of the disclosure.

In the embodiment of the disclosure, the substrate is etched to obtain the multiple first trenches. When forming the first trenches, the lower half of each trench is widened so that the cross-sectional width of each first trench increases downward along the vertical direction. Referring to FIG. 4A to FIG. 4C, they show schematic diagrams during manufacturing the shallow trench isolation structure provided by the embodiment of the disclosure. As shown in FIG. 4A, the substrate 201 is provided with the multiple first trenches. For each first trench, the cross-sectional shape of the upper half is almost constant, but the cross-sectional width of the lower half gradually increases with the depth, that is, the cross-sectional width of a position a is smaller than that of a position b.

Here, the first trenches may be obtained by etching the substrate. A specific etching process may be selected according to an actual application scenario, which is not limited in the embodiment of the disclosure. Therefore, in some embodiments, forming the multiple first trenches in the substrate may include: etching the substrate by a preset etching process to obtain the multiple first trenches. The preset etching process includes at least one of a dry etching process or a wet etching process.

It should also be noted that when etching the first trenches, it is necessary to control specific parameters of the etching process, so that the cross-sectional width of each first trench increases downward along the vertical direction. The specific control method depends on an etching equipment, the type of the etching process, materials to be etched, etc., and those skilled in the art may design according to theoretical knowledge in the art.

In addition, a widening degree of the first trenches may be determined according to actual application requirements. Generally, the maximum cross-sectional width of the upper half of each first trench is smaller than that of the lower half of each first trench. Alternatively, in some embodiments, the maximum cross-sectional width of the upper half of each first trench may be equal to that of the lower half of each first trench.

In particular, in an embodiment that the dry etching process is used, an etching gas for the preset etching process includes at least one of sulfur hexafluoride ($SF_6$), a fluorocarbon (CFs), chlorine ($Cl_2$) or argon (Ar).

That is, in some implementations, each first trench is V-shaped, and its cross-sectional width gradually decreases downward along the vertical direction. However, in the embodiment of the disclosure, the lower half of each first trench is widened, so the cross-sectional width of each first trench increases downward along the vertical direction.

At S102, a continuous first isolation layer is formed on a top of the substrate and inner sides of the multiple first trenches by a deposition process, in which parts of the first isolation layer located in the first trenches form second trenches, and in which a cross-sectional width of each of the second trenches remains constant downward along the vertical direction.

It should be noted that the first isolation layer is deposited on the substrate by the deposition process after the multiple first trenches are formed, and the second trenches are formed from the parts of the first isolation layer located inside the first trenches, and the cross-sectional width of each second trench remains constant downward along the vertical direction.

Referring to FIG. 4B, it shows a second schematic diagram during manufacturing the shallow trench isolation structure provided by the embodiment of the disclosure. As shown in FIG. 4B, the first isolation layer 202 is deposited on the top of the substrate and the inner sides of the multiple first trenches. The parts of the first isolation layer 202 in the first trenches form the second trenches. Each second trench is U-shaped, that is, the cross-sectional width of each second trench remains constant downward along the vertical direction.

Further, in some embodiments, when the second trenches are formed from the parts of the first isolation layer located in the first trenches, the thickness of the first isolation layer is controlled to increase downward along the vertical direction, so that the cross-sectional width of each second trench remains constant downward along the vertical direction.

It should also be noted that the thickness of the first isolation layer is not uniform, since the cross-sectional width of the first trench is increased in the lower half. In a specific embodiment, forming the continuous first isolation layer on the top of the substrate and the inner sides of the multiple first trenches by a deposition process may include: performing deposition on the substrate provided with the multiple first trenches, by an atomic layer deposition (ALD) process with a preset step coverage rate to obtain the first isolation layer.

The ALD process includes at least one of a plasma enhanced ALD process (PE-ALD process), a catalyst ALD process or a thermal ALD process.

It should be noted that the first isolation layer may be obtained by the ALD process. Specifically, the substrate is generally made of polysilicon. In the ALD process, oxygen is continuously introduced into the substrate, and the substrate is kept at a preset temperature and a preset pressure. At this time, polysilicon on the surface of the substrate will be gradually oxidized into silicon oxide, obtaining the first isolation layer. That is, when the first isolation layer is deposited by the ALD process, the oxygen introduced during the ALD process will consume the polysilicon substrate, so it is necessary to control an oxygen flow rate, an ionization intensity, the temperature or the pressure to control the consumption of the substrate.

It should also be noted that when forming the first isolation layer, it is necessary to adopt a low step coverage rate, so that a part of the first isolation layer located at the lower part of each first trench is thicker and a part of the first isolation layer located at the upper part of the first trench is thinner, thereby forming the U-shaped second trenches. For example, in case of the ALD process, the low step coverage rate may be obtained by means of adjusting a flow rate of the ALD process, prolonging a seed time and so on.

Preferably, the preset step coverage rate is less than or equal to 80%.

It should also be noted that in some embodiments, the PE-ALD process may be used. In this case, a reaction pressure of the ALD process is 0.1 to 10 torr, a reaction temperature of the ALD process is 300-600° C., a reaction gas for the ALD process is oxygen, and a gas flow rate of the ALD process is 0.1 to 10 L/min.

That is, in the embodiment of the disclosure, it is not necessary to deposit polysilicon in the trenches to modify the V-shaped trenches into the U-shaped trenches, which will reduce filling spaces of the isolation layer and thus reduce the isolation and insulation capability. The V-shaped trenches are modified into the U-shaped trenches by directly depositing the isolation layer, which will not reduce the filling spaces of the isolation layer. Moreover, the lower half of each first trench is widened, which will increase the filling spaces of the isolation layer and in turn will increase the isolation and insulation capability.

At S103, a continuous second isolation layer is formed on a surface of the first isolation layer by an ISSG process, in which parts of the second isolation layer located in the second trenches completely fill up the second trenches.

It should be noted that, as shown in FIG. 4C, after filling the first isolation layer 202, the continuous second isolation layer 203 is formed by the ISSG process to fill the second trenches, thus obtaining the shallow trench isolation structure.

Particularly, in the shallow trench isolation structure, the substrate is substantially made of polysilicon, and the first isolation layer and the second isolation layer are substantially made of silicon oxide, so as to play a role of isolation and insulation.

Further, in some embodiments, the reaction temperature of the ISSG process is 900-1050° C., and the reaction pressure of the ISSG process is 0.1-10 torr.

In this way, in the embodiment of the disclosure, only three steps are needed to obtain the shallow trench isolation structure, which simplifies the manufacturing process of the shallow trench isolation structure and improves the isolation efficiency of the shallow trench isolation structure.

One of the feasible solutions will be described below as an example to specifically explain the manufacturing method provided by the embodiment of the disclosure. First, as shown in FIG. 4A, after etching the active area, it is attempted to etch the bottom of each trench a little wider, and there is no need to deposit polysilicon to obtain a desired width of each trench. Secondly, as shown in FIG. 4B, a low step coverage rate is formed in the trenches by a plasma enhanced atomic layer deposition oxidation (PE ALD OX) process, so that the isolation of active areas appears U-shaped. Here, the low step coverage rate is obtained by different flow rates of PE ALD OX and deposition for a longer seed time, and then the thicker isolation layer is formed at the bottom of each trench. Finally, as shown in FIG. 4C, the shallow trench is further filled up by the ISSG process to obtain the shallow trench isolation structure.

In the related embodiment, due to the characteristics of the trenches and the restriction of the manufacturing technology, the trenches formed in the substrate 201 are V-shaped, and subsequently polysilicon needs to be deposited to shorten the cross-sectional width of an upper part of each trench to obtain the U-shaped trenches, such that the width of each trench actually used for being filled with the isolation layer is further reduced (see the oval part in FIG. 2D) and the isolation property is reduced. In the embodiment of the disclosure, the lower half of each first trench is widened, and the width of each trench is increased, compared with the V-shaped trenches. Moreover, it is not necessary to deposit polysilicon again to modify the trench shape, and the trench shape is modified by directly depositing the isolation layer, which further increases the width of each trench (see the oval part in FIG. 4C). As such, the isolation property is improved, and the leakage current can also be reduced.

In this way, the embodiment of the disclosure provides a new method for manufacturing the shallow trench isolation structure. Firstly, the active area trenches are formed by dry etching, then the deposition of silicon oxide by plasma enhanced atomic layer deposition is used to replace the deposition of polysilicon and the HQO furnace tube procedure, and then the ISSG process is performed to obtain the shallow trench isolation structure. Compared with some implementations, one procedure can be reduced and the HQO furnace tube procedure is replaced in the embodiment of the disclosure, such that the difference between different wafers can be reduced more, and a better isolation and insulation effect can be obtained, and the occurrence of leakage current can also be reduced.

The embodiment of the disclosure provides a method for manufacturing a shallow trench isolation structure. In the method, a substrate is provided and multiple first trenches are formed in the substrate, in which a cross-sectional width of each first trench increases downward along a vertical direction. A continuous first isolation layer is formed on a top of the substrate and inner sides of the multiple first trenches by a deposition process, in which parts of the first isolation layer located in the first trenches form second trenches, and in which a cross-sectional width of each second trench remains constant downward along the vertical direction. A continuous second isolation layer is formed on a surface of the first isolation layer by an ISSG process, in which parts of the second isolation layer located in the second trenches completely fill up the second trenches. In this way, when the multiple first trenches are formed, the cross-sectional width of each trench is controlled to increase downward along the vertical direction. Then, the cross-sectional width of each trench is modified to remain constant downward along the vertical direction by the first isolation layer. Finally, the trenches are filled up. By this method, the manufacturing process of the shallow trench isolation structure is simplified and the insulation property of the shallow trench isolation structure is improved.

Figure 5:
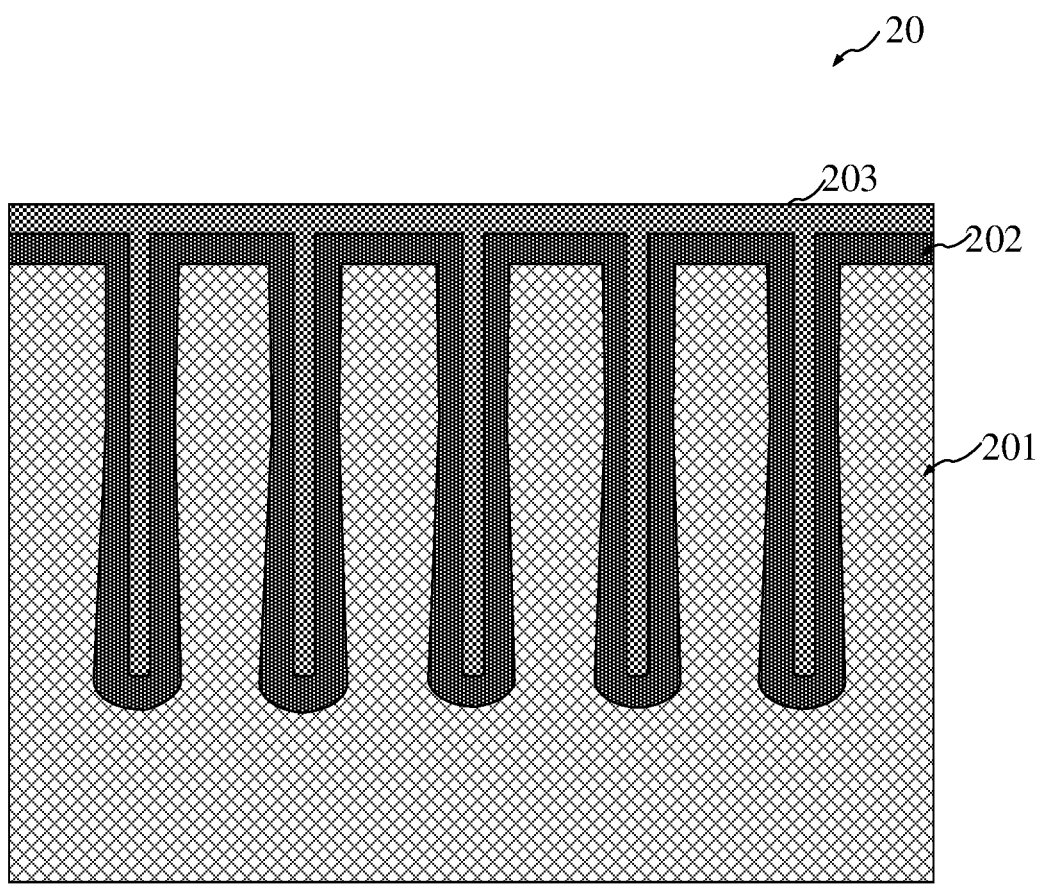
FIG. 5 is a schematic structural diagram of a shallow trench isolation structure provided by an embodiment of the disclosure.

In another embodiment of the disclosure, referring to FIG. 5, it shows a schematic structural diagram of a shallow trench isolation structure 20 provided by the embodiment of the disclosure. As shown in FIG. 5, the shallow trench isolation structure 20 may include a substrate 201, a first isolation layer 202 and a second isolation layer 203.

The substrate 201 includes multiple first trenches, and a cross-sectional width of each first trench increases downward along a vertical direction.

The first isolation layer 202 located on inner sides of the first trenches and a top of the substrate 201. Parts of the first isolation layer 202 located in the first trenches form second trenches. A cross-sectional width of each second trench remains constant downward along the vertical direction.

The second isolation layer 203 is located on a surface of the first isolation layer 202. Parts of the second isolation layer 203 located in the second trenches completely fill up the second trenches.

It should be noted that the embodiment of the disclosure provides the shallow trench isolation structure, which is applied to semiconductors. The shallow trench isolation structure includes the substrate 201, the first isolation layer 202 and the second isolation layer 203. The multiple first trenches are provided in the substrate 201, and the lower half of each first trench is widened compared with the upper half, so the cross-sectional width of each first trench increases downward along the vertical direction. Then, the first isolation layer 202 fills the first trenches to modify the cross-sectional shape of each first trench to be a U-shape, such that second trenches are obtained, the cross-sectional width of each of which remains constant downward along the vertical direction. Finally, the second trenches are completely filled with the second isolation layer 203.

In the related embodiment, due to the characteristics of the trenches and the restriction of the manufacturing technology, each trench formed in the substrate 201 is V-shaped, and subsequently polysilicon needs to be deposited to shorten the cross-sectional width of an upper part of each trench to obtain the U-shaped trenches, such that the width of each trench actually used for being filled with the isolation layer is further reduced (see the oval part in FIG. 2D) and the isolation property is reduced. In the embodiment of the disclosure, the lower half of each first trench is widened, and the width of each trench is increased, compared with the V-shaped trenches. Moreover, it is not necessary to deposit polysilicon again to modify the trench shape, and the trench shape is modified by directly depositing the isolation layer, which further increases the width of each trench (see the oval part in FIG. 4C). As such, the isolation property is improved, and the leakage current can also be reduced.

Preferably, in some embodiments, the maximum cross-sectional width of the upper half of each first trench is smaller than that of the lower half of each first trench.

It should be noted that, in the embodiment of the disclosure, when etching the first trenches, it is necessary to control the parameters of an etching process so that the cross-sectional width of each first trench increases downward along the vertical direction. Here, the etching process may be determined according to actual application scenarios. That is, the first trenches are formed by etching the substrate 201 with a preset etching process. The preset etching process includes at least one of a dry etching process or a wet etching process.

Particularly, when the first trenches are obtained by the dry etching process, an etching gas for the preset etching process may include one or more of sulfur hexafluoride ($SF_6$), a fluorocarbon (CFs), chlorine ($Cl_2$) or argon (Ar).

Further, since the cross-sectional width of each first trench increases along the vertical direction, the thickness of the first isolation layer 202 needs to be increased downward along the vertical direction, so that the cross-sectional width of each correspondingly formed second trench remains constant along the vertical direction.

In a specific embodiment, the U-shaped second trenches are obtained by controlling a step coverage rate during the formation of the first isolation layer 202. Therefore, the first isolation layer 202 is formed by performing deposition on the substrate 201 formed with the multiple first trenches, by an atomic layer deposition (ALD) process based on a preset step coverage rate. The ALD process includes at least one of a plasma enhanced ALD process, a catalyst ALD process or a thermal ALD process.

Preferably, the preset step coverage rate is less than or equal to 80%. For the plasma enhanced ALD process, a reaction pressure of the ALD process is 0.1-10 torr, a reaction temperature of the ALD process is 300-600° C., a reaction gas for the ALD process is oxygen, and a gas flow rate of the ALD process is 0.1-10 L/min.

It should be noted that the manufacturing process of the second isolation layer 203 may be selected according to requirements. In a specific embodiment, the second isolation layer 203 is formed by performing deposition on the substrate 201 formed with the multiple second trenches, by an ISSG process until the second trenches are filled up.

Preferably, a reaction temperature of the ISSG process is 900-1050° C., and a reaction pressure of the ISSG process is 0.1-10 torr.

Particularly, both the first isolation layer 202 and the second isolation layer 203 include silicon oxide to achieve an isolation property.

An embodiment of the disclosure provides a shallow trench isolation structure, which includes a substrate, a first isolation layer and a second isolation layer. The substrate includes multiple first trenches, and a cross-sectional width of each first trench increases downward along a vertical direction. The first isolation layer is located on inner sides of the first trenches and a top of the substrate, and parts of the first isolation layer located in the first trenches form second trenches, and a cross-sectional width of each second trench remains constant downward along the vertical direction. The second isolation layer is located on a surface of the first isolation layer, and parts of the second isolation layer located in the second trenches completely fill up the second trenches. In this way, when the multiple first trenches are formed, the cross-sectional width of each trench is controlled to increase downward along the vertical direction. Then the cross-sectional width of each trench is modified to remain constant downward along the vertical direction by the first isolation layer. Finally, the trenches are filled up to obtain the shallow trench isolation structure. By the embodiment, the manufacturing process of the shallow trench isolation structure is simplified and the insulation property of the shallow trench isolation structure is improved.

Figure 6:
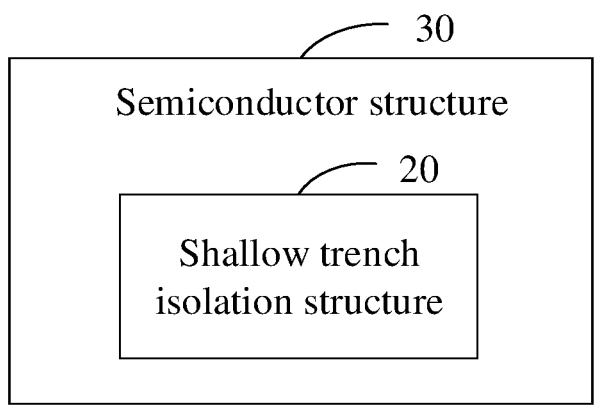
FIG. 6 is a schematic structural diagram of a semiconductor structure provided by an embodiment of the disclosure.

In another embodiment, referring to FIG. 6, it shows a semiconductor structure 30 provided by the embodiment of the disclosure. As shown in FIG. 6, the semiconductor structure 30 includes the shallow trench isolation structure 20 described in any of the previous embodiments.

As for the semiconductor structure 30, it includes the shallow trench isolation structure 20. When the multiple first trenches are formed, the cross-sectional width of each trench is controlled to increase downward along the vertical direction. Then, the cross-sectional width of each trench is modified to remain constant downward along the vertical direction by the first isolation layer. Finally, the trenches are filled up to obtain the shallow trench isolation structure. In this way, the manufacturing process of the shallow trench isolation structure is simplified and the insulation property of the shallow trench isolation structure is improved.

In yet another embodiment, a memory is provided, which includes the aforementioned semiconductor structure 30. As for the memory, it includes the semiconductor structure 30. When the multiple first trenches are formed, the cross-sectional width of each trench is controlled to increase downward along the vertical direction. Then, the cross-sectional width of each trench is modified to remain constant downward along the vertical direction by the first isolation layer. Finally, the trenches are filled up to obtain the shallow trench isolation structure. In this way, the manufacturing process of the shallow trench isolation structure is simplified and the insulation property of the shallow trench isolation structure is improved.

The above are only the preferred embodiments of this disclosure, and are not intended to limit the scope of protection of this disclosure.

It should be noted that the term "include", "comprise" or any other variation thereof used in this disclosure means non-exclusive inclusion, so that a process, method, article or device that includes a series of elements not only includes these elements, but also includes other elements not explicitly listed, or also includes elements inherent to such process, method, article or device. Without further limitations, an element defined by the statement "include one . . . " does not exclude the presence of additional identical elements in the process, method, article or device that includes the element.

The serial numbers of the above embodiments of the disclosure are merely used for description, and do not represent the preferability of the embodiments.

The methods disclosed in the several method embodiments provided in this disclosure may be arbitrarily combined without conflict to obtain a new method embodiment.

The features disclosed in the several product embodiments provided in this disclosure may be arbitrarily combined without conflict to obtain a new product embodiment.

The features disclosed in the several method or device embodiments provided in this disclosure may be arbitrarily combined without conflict to obtain a new method or device embodiment.

The above is only the specific implementation of the embodiments of the disclosure, but the protection scope of the embodiments of the disclosure is not limited thereto. Any changes or replacements easily thought of by a person skilled in the art within the technical scope disclosed by the embodiments of the disclosure should be covered within the protection scope of the embodiments of the disclosure. Therefore, the protection scope of the embodiments of the present disclosure should be subject to the protection scope of the claims.

Embodiments of the disclosure provide a method for manufacturing a shallow trench isolation structure, a shallow trench isolation structure and a semiconductor structure. A substrate is provided, and multiple first trenches are formed in the substrate, and a cross-sectional width of each first trench increases downward along a vertical direction. A continuous first isolation layer is formed on a top of the substrate and inner sides of the multiple first trenches by a deposition process and parts of the first isolation layer located in the first trenches form second trenches, in which a cross-sectional width of each second trench remains constant downward along the vertical direction. A continuous second isolation layer is formed on a surface of the first isolation layer by an ISSG process, in which parts of the second isolation layer located in the second trenches completely fill up the second trenches. In this way, when the multiple first trenches are formed, the cross-sectional width of each trench is controlled to increase downward along the vertical direction. Then, the cross-sectional width of each trench is modified to remain constant downward along the vertical direction by the first isolation layer. Finally, the trenches are filled up to obtain the shallow trench isolation structure. By the embodiments of the disclosure, the manufacturing process of a shallow trench isolation structure is simplified and the insulation property of a shallow trench isolation structure is improved.

What is claimed is:

1. A method for manufacturing a shallow trench isolation structure, comprising:

providing a substrate and forming multiple first trenches in the substrate, wherein a cross-sectional width of each of the first trenches increases downward along a vertical direction;

forming a first isolation layer, which is continuous, on a top of the substrate and inner sides of the multiple first trenches by an atomic layer deposition (ALD) process with a preset step coverage rate, wherein the ALD process comprises at least one of a plasma enhanced ALD process, a catalyst ALD process or a thermal ALD process, the preset step coverage rate is less than 80%, and parts of the first isolation layer located in the first trenches form second trenches with a thickness of the first isolation layer being controlled to increase downward along the vertical direction, and wherein a cross-sectional width of each of the second trenches remains constant downward along the vertical direction; and forming a second isolation layer, which is continuous, on a surface of the first isolation layer by an ISSG process, wherein parts of the second isolation layer located in the second trenches completely fill up the second trenches.

2. The method according to claim 1, wherein a maximum cross-sectional width of an upper half of each of the first trenches is less than or equal to that of a lower half of each of the first trenches.

3. The method according to claim 1, wherein the forming the multiple first trenches in the substrate comprises:

etching the substrate by a preset etching process to obtain the multiple first trenches, wherein the preset etching process comprises at least one of a dry etching process or a wet etching process.

4. The method according to claim 3, wherein when the preset etching process is the dry etching process, an etching gas for the preset etching process comprises at least one of sulfur hexafluoride $SF_6$, a fluorocarbon CFs, chlorine $Cl_2$ or argon Ar.

5. The method according to claim 1, wherein a reaction pressure of the ALD process is 0.1-10 torr, a reaction temperature of the ALD process is 300-600° C., a reaction gas for the ALD process is oxygen, and a gas flow rate of the ALD process is 0.1-10 L/min.

6. The method according to claim 1, wherein the forming the second isolation layer, which is continuous, on the surface of the first isolation layer by the ISSG process comprises:

performing deposition on the substrate formed with multiple second trenches, by the ISSG process until the multiple second trenches are filled up to obtain the second isolation layer.

7. The method according to claim 6, wherein a reaction temperature of the ISSG process is 900-1050° C., and a reaction pressure of the ISSG process is 0.1-10 torr.

8. The method according to claim 1, wherein the first isolation layer and the second isolation layer comprise silicon oxide.

* * * * *